United States Patent
DiSimone et al.

[11] Patent Number: 6,118,167
[45] Date of Patent: *Sep. 12, 2000

[54] POLYSILICON COATED NITRIDE-LINED SHALLOW TRENCH

[75] Inventors: Eugene DiSimone, Santa Clara; Paramjit Singh, Newark, both of Calif.

[73] Assignee: National Semiconductor Corporation, Santa Clara, Calif.

[ * ] Notice: This patent issued on a continued prosecution application filed under 37 CFR 1.53(d), and is subject to the twenty year patent term provisions of 35 U.S.C. 154(a)(2).

[21] Appl. No.: 08/969,400

[22] Filed: Nov. 13, 1997

[51] Int. Cl.⁷ ............................. H01L 21/76; H04L 21/76
[52] U.S. Cl. .................... 257/510; 257/506; 257/508; 257/538; 257/539
[58] Field of Search ..................... 257/510, 538, 257/539, 506, 508

[56] References Cited

U.S. PATENT DOCUMENTS

| | | | |
|---|---|---|---|
| 4,571,819 | 2/1986 | Rogers et al. | 257/510 |
| 4,631,803 | 12/1986 | Hunter et al. | 257/510 |
| 4,689,656 | 8/1987 | Silvestri et al. | 357/49 |
| 4,842,675 | 6/1989 | Chapman et al. | 156/643 |
| 4,983,226 | 1/1991 | Hunter et al. | 257/513 |
| 5,108,946 | 4/1992 | Zdebel et al. | 437/72 |
| 5,116,779 | 5/1992 | Iguchi | 437/67 |
| 5,130,268 | 7/1992 | Liou et al. | 437/67 |
| 5,250,836 | 10/1993 | Miura et al. | 257/510 |
| 5,410,176 | 4/1995 | Liou et al. | 257/50 |
| 5,576,241 | 11/1996 | Sakai | 437/63 |
| 5,598,019 | 1/1997 | Komori et al. | 257/397 |
| 5,786,263 | 7/1998 | Perera | 438/431 |

FOREIGN PATENT DOCUMENTS 54-128298  10/1979  Japan .

OTHER PUBLICATIONS

New Techniques for Elimination of the Bird's Head and Bird's Beak, Burton, et al., 26.3, International Electron Devices Meeting, San Francisco, CA, Dec. 9–12, 1984, pp. 582–585.

J. Cheng, et al., "A Novel Shallow Trench Isolation Technique" Japanese Journal of Apllied Physics, vol. 36, No. 38, pp. 1319–1321 (Mar. 1997).

*Primary Examiner*—Leo P. Picard
*Assistant Examiner*—Hung Van Duong
*Attorney, Agent, or Firm*—Limbach & Limbach L.L.P.

[57] ABSTRACT

A polycrystalline silicon coated nitride-lined shallow trench technique for isolating active regions on an integrated circuit involves reducing the oxide encroachment and the "bird's beak" structure. The technique involves forming an isolation trench, or recess, in the substrate. This recess is then lined with a layer of silicon dioxide layer, and then a layer of silicon nitride. Subsequently, a polycrystalline silicon material is deposited in the recess and is then oxidized to form a field oxide and planarized. Since the recess is nitride-lined, which prevents oxidizing species from reaching the oxide layer beneath the nitride layer, and the polycrystalline silicon is oxidized, the result is zero oxide encroachment resulting in the elimination of the "bird's beak" structure.

20 Claims, 8 Drawing Sheets

POLYSILICON COATED NITRIDE-LINED SHALLOW TRENCH

BACKGROUND OF THE INVENTION

1. Field of the Invention

The present invention relates to technologies for isolating devices in integrated circuits and, in particular, to a poly coated nitride-lined technology.

2. Related Art

Integrated circuits are formed by interconnecting isolated devices through particular electrical paths. As a result, isolation technology is an important aspect of fabricating integrated circuits.

Since different integrated circuits have different isolation requirements, various techniques have been used to isolate devices. These various isolation techniques exhibit different attributes, with respect to minimum isolation spacing, surface planarity, process complexity, and density of defects generated during fabrication of the isolation structure. Tradeoffs can be made among these characteristics when selecting an isolation technology for a particular circuit application.

Generally, different isolation techniques are used for metal oxide semiconductor (MOS) devices and bipolar devices. Two common junction isolation techniques used in bipolar devices, are the standard buried collector (SBC) process and the collector diffused isolation (CDI) process. However, these techniques exhibit several disadvantages. Both processes utilize isolation diffusions which cause large collector-to-base and collector-to-substrate capacitances, which reduce the speed of the circuit. In addition, both processes result in low collector-base junction breakdown voltages which limits the use of these circuits to applications requiring small power-supply voltages. The SBC process has the added disadvantage that wide isolation regions correspond to large inactive areas on the silicon surface, which can limit the packing density of the integrated circuit.

One standard industry technique used to isolate devices in p-channel MOS (PMOS) and n-channel MOS (NMOS) integrated circuits is LOCOS (LOcal Oxidation of Silicon). This technique involves forming a semirecessed oxide in the nonactive (or field) areas of the substrate.

Figure 1A:
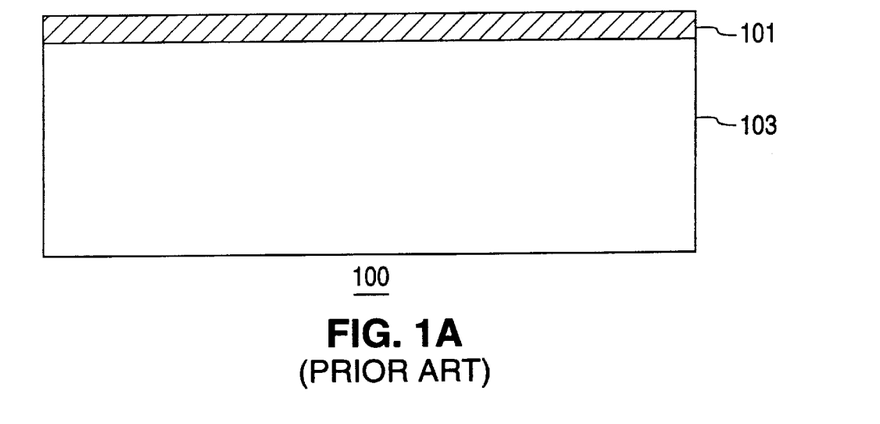
FIGS. 1A–1D illustrates a conventional isolation technique.

A typical sequence of the operations involved in a conventional semi-recessed LOCOS technique is shown in FIGS. 1A–1D. The first step involves thermally growing a silicon dioxide ($SiO_2$) layer 101 on the surface of a substrate 103 of a semiconductor silicon wafer 100, as shown in FIG. 1A. This silicon dioxide layer 101, is often referred to as the pad or buffer oxide, since it operates to cushion the transition of stresses between the silicon substrate and the subsequently deposited nitride layer. In an alternative technique a CVD (chemical vapor deposition) $SiO_2$ is used instead of thermal $SiO_2$.

Figure 1B:
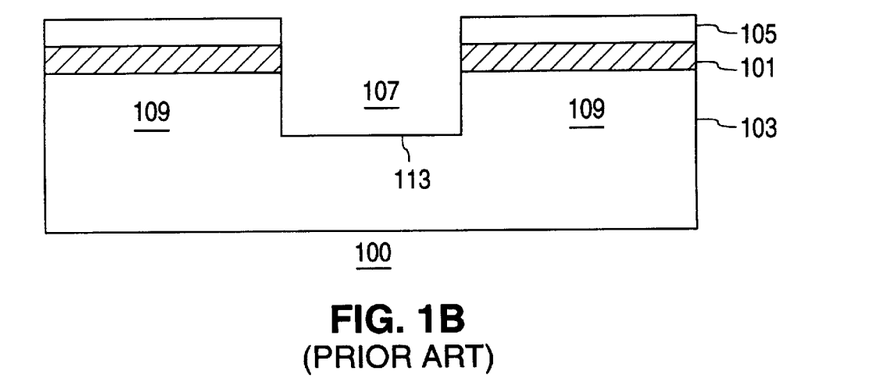

Next, referring to FIG. 1B, a layer of silicon nitride ($Si_3O_4$) 105 is deposited on the silicon dioxide layer 101 and photolithography is used to pattern the two layers 101, 105, so that the desired isolation areas 107 are exposed, and the desired active areas 109 (i.e., those regions of the integrated circuit where active devices are to be formed) are covered with an oxidation barrier. The silicon nitride layer 105 is then dry etched, and the pad oxide 101 and the silicon substrate 103 are etched by means of either a dry or a wet chemical process, to form an isolation trench 113.

Figure 1C:
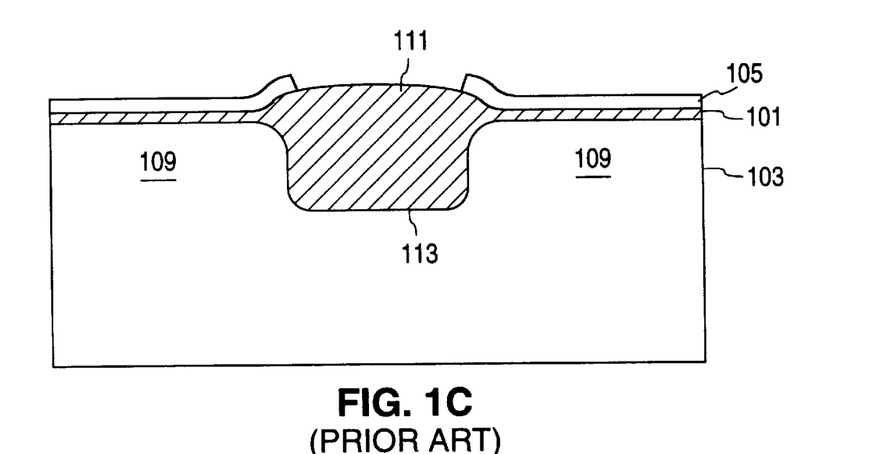
Figure 1D:
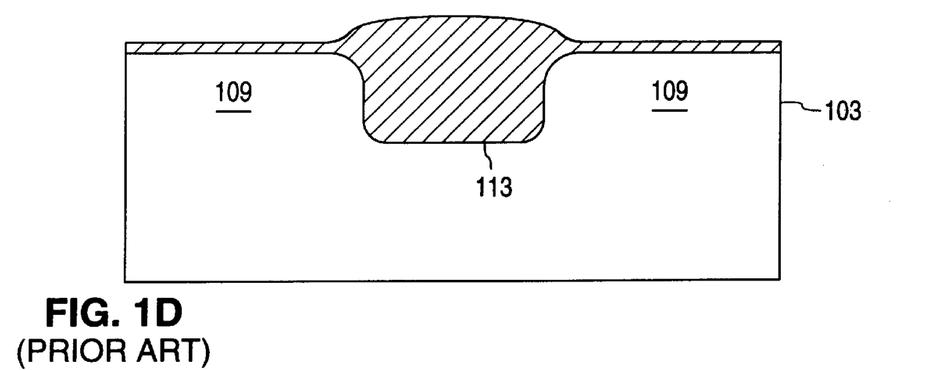

Subsequently, a field oxide 111 is thermally grown on the exposed silicon regions by using high-pressure oxidation (HIPOX), as shown in FIG. 1C. The field oxide 111 grows where there is no masking nitride 105. However, at the edges of the nitride 105, some oxygen diffuses laterally causing the field oxide 111 to grow under and lift these nitride edges. This encroachment of the field oxide layer 111 under the nitride layer 105 causes a tapering oxide wedge that merges into the pad oxide 101, and is referred to as a "bird's beak." Finally, the masking layer 105 is removed, as shown in FIG. 1D.

The conventional semi-recessed LOCOS isolation process described above has the disadvantage of leaving a bird's beak, which causes unacceptably large encroachment of the field oxide into the device active regions. This in turn reduces the packing density and active area available for making the devices. In addition, the growth of the field oxide in the trench causes stresses that can lead to defects in the silicon. Typically, defect-generating stresses arise at the bottom corners of the etched grooves during field oxide growth and are due to the volume expansion of the growing oxide.

First, as the oxide grows, its top surface is pushed outward by the newly forming oxide layer at the silicon substrate and silicon dioxide ($SiO_2$) interface. This volume expansion causes tangential stresses in the corners of the trench. Second, as the laterally encroaching oxide grows under the nitride, it is restrained from growing upward by the stiffness of the nitride layer, causing further stress downward against the silicon in the corner of the recess. These stresses, if not relieved, can generate dislocations in the silicon such as line defects and stacking faults.

Another conventional isolation technique is the sidewall-masked isolation (SWAMI) technique, as shown in FIGS. 2A–2F. This technique offers two significant advantages over the conventional semi-recessed LOCOS: reduction of the bird's beak structure and an increase in packing density due to the reduction of lateral oxide encroachment. This technique involves forming a pad-oxide layer 101 and a CVD-nitride layer 105 on top of the silicon substrate 103, and then etching these three layers in the same manner as in conventional Semi-recessed LOCOS to form isolation trench 113, as shown in FIGS. 1A–1B.

Figure 2A:
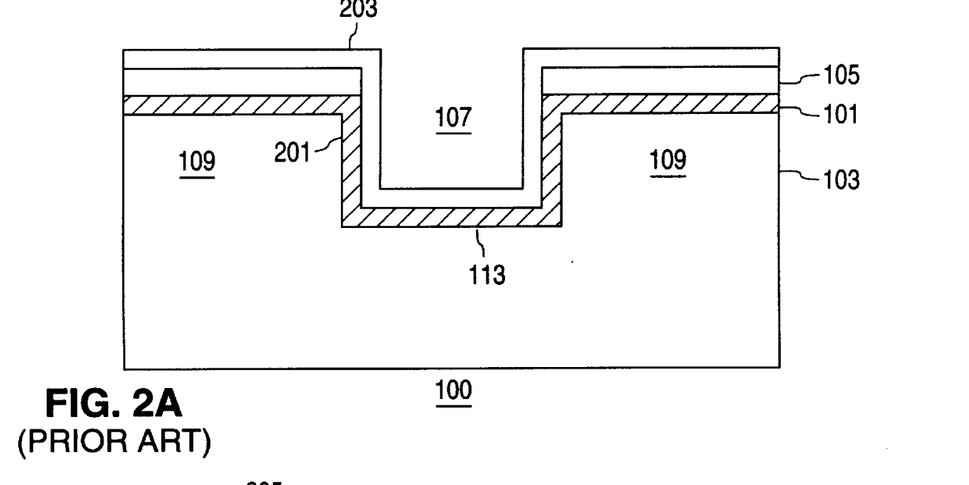
FIGS. 2A–2F illustrate another conventional isolation technique.
Figure 2B:
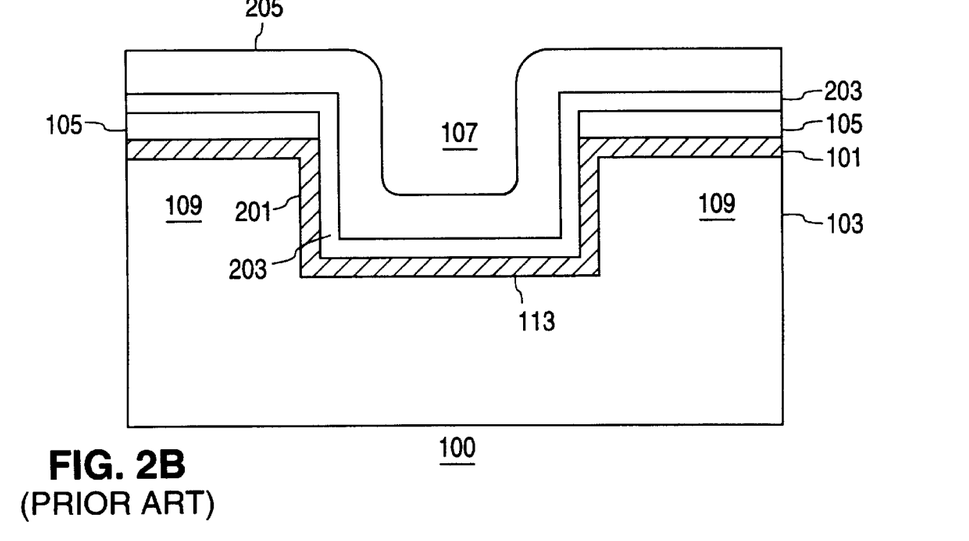
Figure 2C:
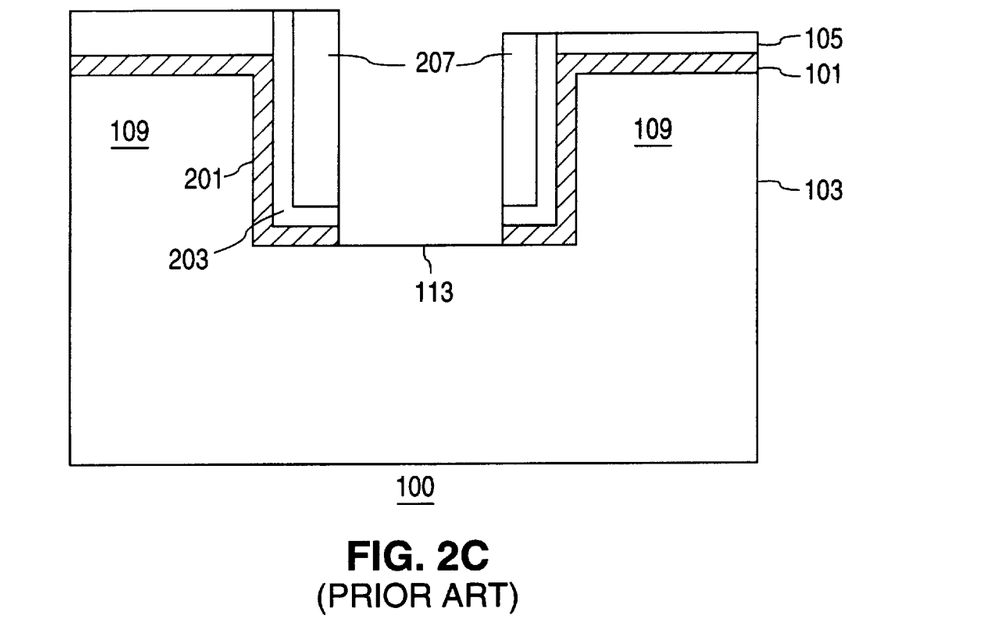
Figure 2D:
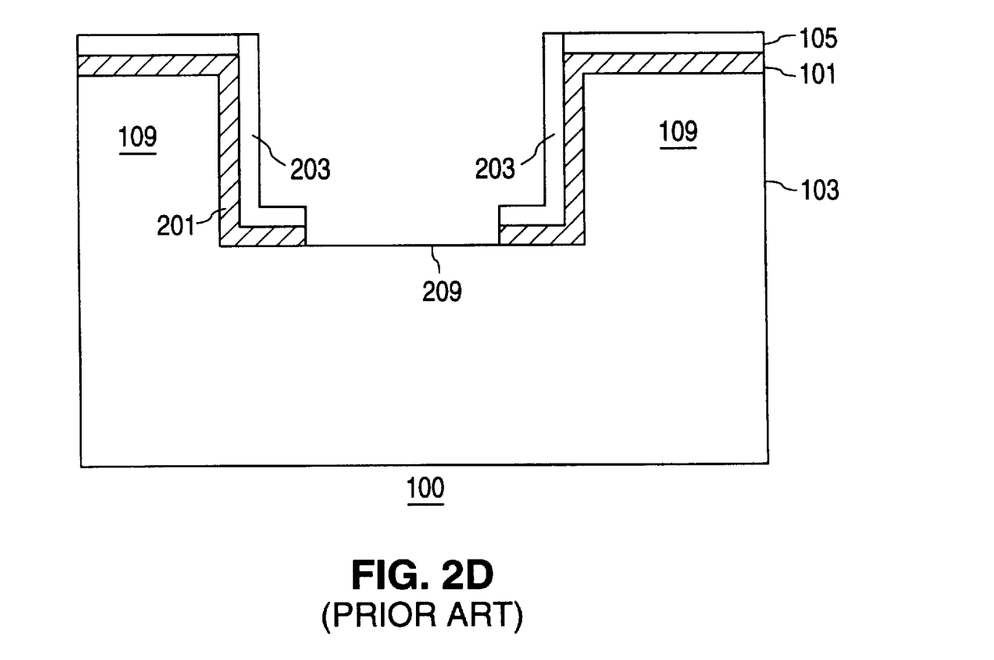

Subsequently, as shown in FIG. 2A, a second stress-relief oxide layer 201 is grown followed by the deposition of a second CVD nitride layer 203, which provides conformal coverage of the entire surface, including the sidewalls of the silicon trench 113. Then a CVD oxide 205 is deposited on the second CVD nitride layer 203, as shown in FIG. 2B. All three layers 201, 203, 205 are then anisotropically etched in the field region such that the layers 201, 203, 205 remain only on the sidewalls of the trench and in the corners of the trench (foot), as shown in FIG. 2C. The CVD oxide 205 forms a spacer that protects only part of the second nitride layer 203, and this nitride layer 203 forms a structure with a foot that extends partway into the exposed silicon at the bottom of the trench 113. Typically, the oxide sidewall spacer 207 is removed. After the oxide spacer has been etched away, the final structure is a silicon mesa whose sidewalls are surrounded by the second nitride layer 203 and oxide 201, as shown in FIG. 2D.

Figure 2E:
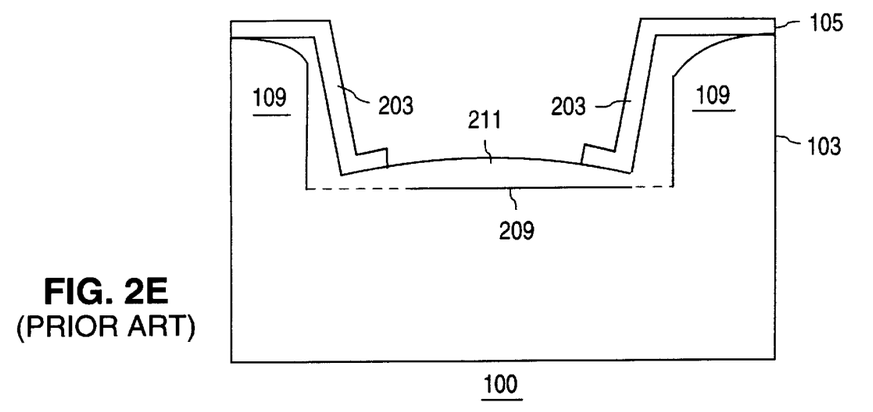
Figure 2F:
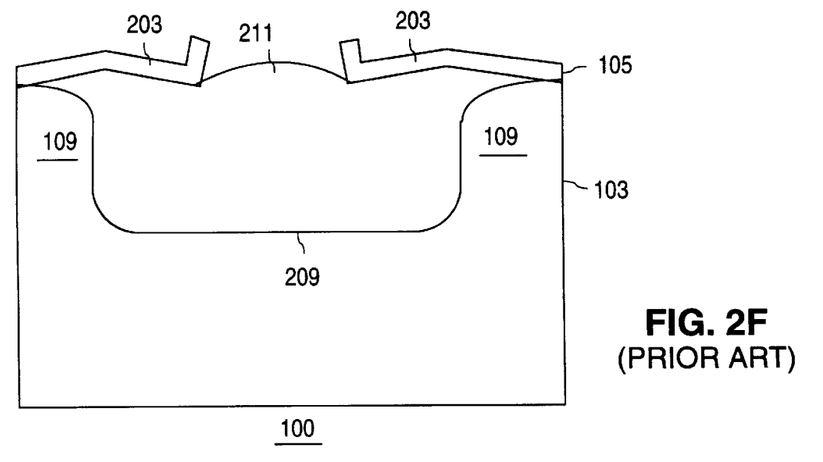

In the next step, the field oxide is grown and the thin sidewall nitride 203 is bent upward due to the expansion of the converted $SiO_2$ oxide 211, as shown in FIG. 2E. As the oxide expands, the sidewall nitride 203 continues to bend upward as shown in FIG. 2F. Finally the masking nitride layers are removed. This process reduces the bird's beak structure and achieves a relatively planar surface topography.

Although this process is an improvement over the conventional LOCOS isolation technique, this process has some disadvantages. First, the sidewall nitride 203 rises during oxidation, allowing for some encroachment although it is less than that in conventional LOCOS. In addition, this process yields excessive stresses at the corners of the trench, since oxide growth in that region is restrained due to nitride compression.

Another technique for eliminating the bird's beak is described in an article entitled "New Techniques for Elimination of the Bird's Head and Bird's Beak," by Burton et al., 1984, IEDM, pp. 582–585, hereby incorporated by reference. This article discloses a field isolation method requiring two processing steps in addition to the conventional recessed isoplanar process, namely (1) a polysilicon sidewall spacer formation and (2) an oxide "bump" planarization. A polysilicon sidewall is used to reduce oxide encroachment during the field oxidation step. The process sequence is shown in FIGS. 1A–1B and 3A–3E.

Figure 3A:
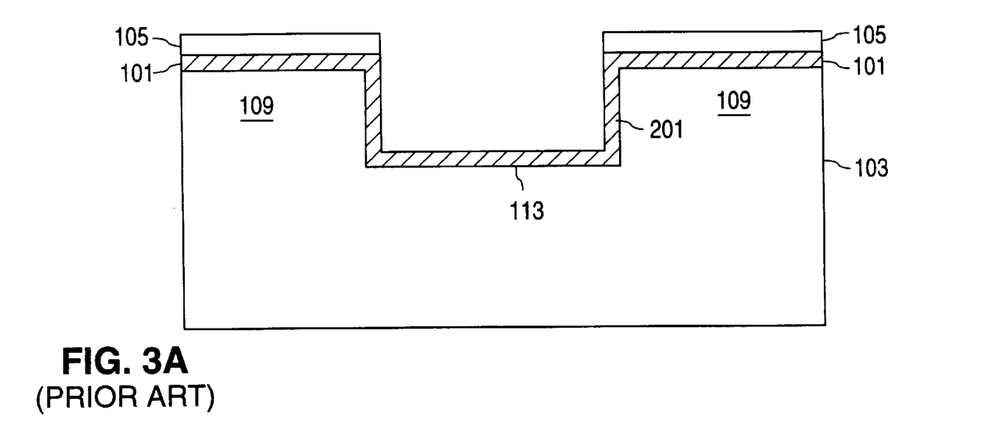
FIGS. 3A–3E illustrate another conventional isolation technique.
Figure 3B:
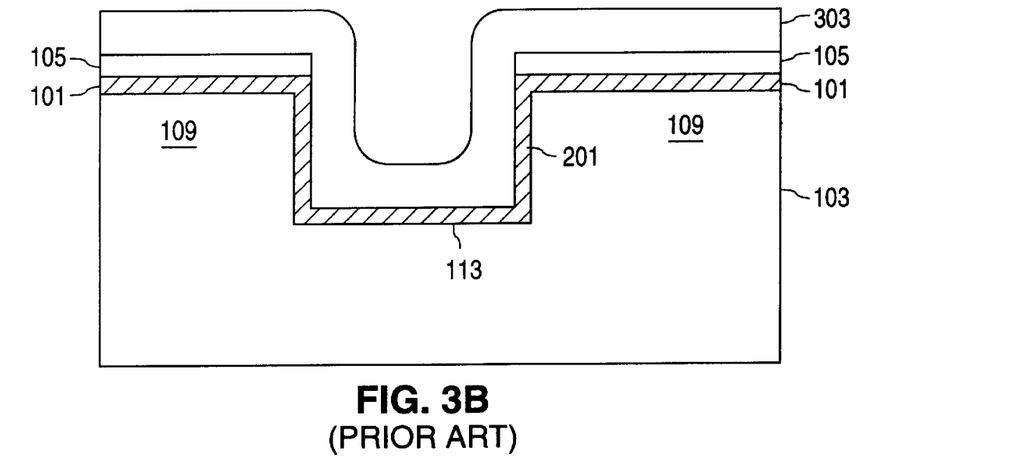
Figure 3C:
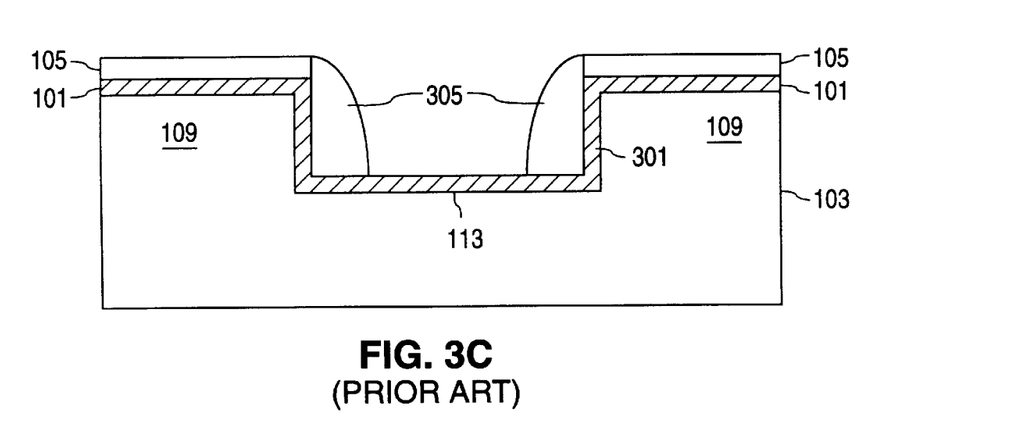

The first steps of the technique are analogous to those shown in FIGS. 1A–1B. Subsequently, a second oxide layer 301 is grown on the trench, as shown in FIG. 3A. However, before a regular field oxidation in a recessed isoplanar technique, a polysilicon sidewall spacer 305 is formed along the sidewall of the trench region by low pressure chemical vapor deposition (LPCVD), polysilicon deposition 303 and anisotropic etchback (FIGS. 3B and 3C).

During the subsequent field oxidation, the outer layer of polysilicon along the sidewall is oxidized first and transformed into silicon dioxide 309. This method works in such a way that oxidation at the silicon nitride/silicon dioxide/silicon interface does not take place until the polysilicon sidewall spacer 305 is completely oxidized into silicon dioxide 309. The polysilicon spacer 305, by virtue of the delaying action, allows for the bird's beak to be reduced to a zero value as shown in FIG. 3D.

Figure 3D:
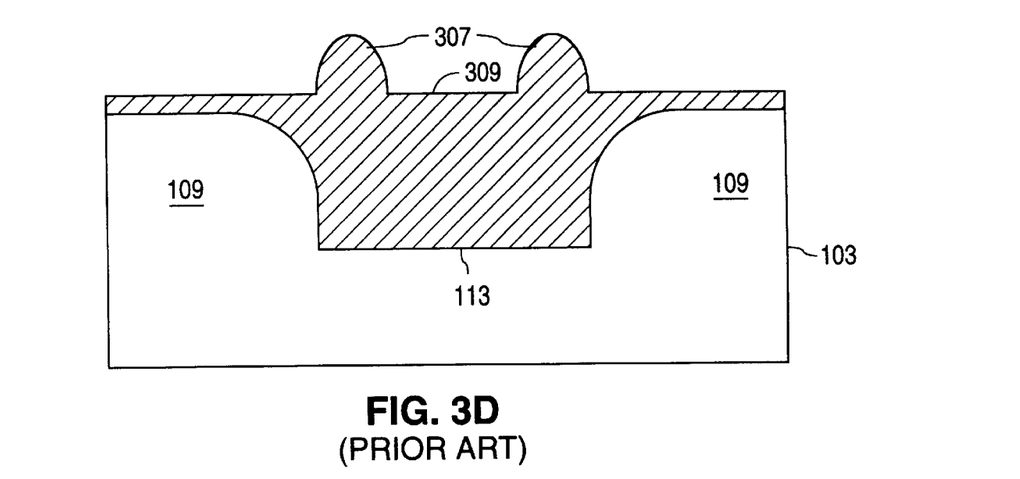
Figure 3E:
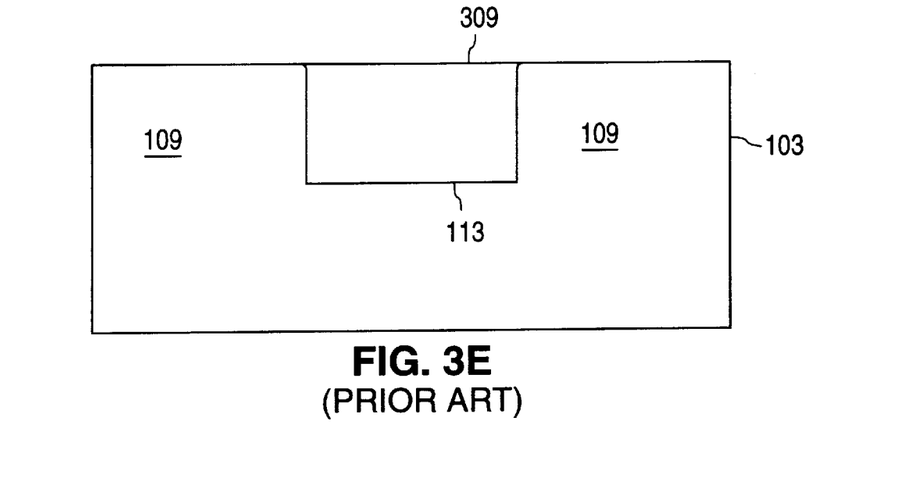

The oxidation of the polysilicon sidewall generates an oxide "bump" 307 at the boundary between field and active region as shown in FIG. 3D. This undesirable protrusion can be removed using some available planarization technique to yield the resulting structure shown in FIG. 3E.

Although this process sequence is an improvement over the conventional LOCOS process sequence, this process sequence requires a difficult planarization scheme.

Thus, a need exists to increase the packing density on an integrated circuit, eliminate oxide encroachment without requiring a difficult planarization scheme, and minimize the formation of stresses in the silicon, while maintaining a short processing time and low processing cost.

SUMMARY OF THE INVENTION

A technique for isolating devices in an integrated circuit includes forming an isolation trench having a nitride lining, and oxidizing polycrystalline over monocrystalline silicon. The technique involves using photolithography to mask active regions and to expose isolation regions, followed by an etch to form a shallow trench in the field or isolation regions. Then an oxide is grown both on the trench and on the areas of the substrate where active devices are to be formed. An oxide-resistant layer is then deposited on this oxide layer to line the trench. Subsequently, polycrystalline silicon is deposited in the trench and on the active regions. The polysilicon is then planarized and oxidized (or oxidized and planarized), and the oxide-resistant layer is removed from the regions of the substrate where active devices are to be formed.

This technique provides several benefits. First, the nitride liner in the trench isolates the single crystal silicon from stresses caused during oxidation. Second, since the polycrystalline silicon is oxidized, negligible stresses occur in the monocrystalline substrate. When the polycrystalline silicon is oxidized, it expands to consume a larger space. This is known as volume expansion. As a result, the polycrystalline silicon grows upward with the silicon nitride layer prohibiting volume expansion into the silicon. Thus, the nitride layer eliminates oxide encroachment that causes the formation of the bird's beak structure and isolates the single crystal silicon from the stresses induced by volume expansion. In contrast, because the conventional techniques involve oxidizing the single crystal silicon, oxide encroachment and silicon stresses occur.

Finally, another advantage of the technique is the additional packing density available in an integrated circuit. Due to the reduction of encroachment of the oxide, the devices can be placed closer together in the integrated circuit, allowing more devices to be placed in a chip.

DETAILED DESCRIPTION OF THE PREFERRED EMBODIMENT

The isolation process of a monolithic integrated circuit involves a sequence of processing steps. FIGS. 4A–4G show cross sectional views illustrating the process technique for achieving isolation of devices on an integrated circuit in accordance with one embodiment of this invention.

In this embodiment, substrate 401 is doped type-N silicon. Although type-N doping is used, it will be appreciated that when a semiconductor material is used as substrate 401, either P or N conductivity type is suitable, as well as any convenient doping level. Additionally, the substrate 401 is consistent with typical silicon semiconductor substrates, although other silicon crystal orientations are suitable for use as substrate 401. Moreover, although the isolation requirements of MOS integrated circuits are somewhat different from those of bipolar integrated circuits, it will be appreciated that the isolation technique of the present invention can be used for both bipolar and MOS integrated circuits.

Figure 4A:
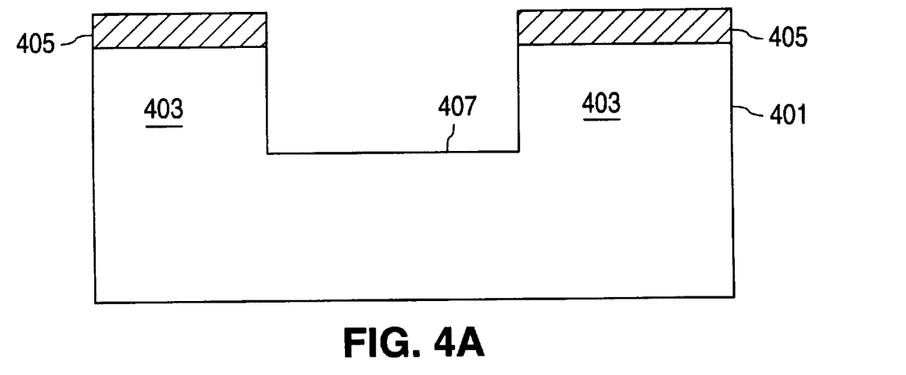
FIGS. 4A–4G illustrate an isolation technique in accordance with one embodiment of the present invention.

Referring to FIG. 4A, the active regions 403 of the silicon substrate 401 are defined with photolithography. A resist pattern 405 is typically used to protect the areas 403 where active devices will be formed. The exposed, or unprotected, areas of the silicon substrate 401, are etched to form a recess, such as an isolation trench 407, in the substrate 401.

The isolation trench 407 can be either fully recessed or shallow (partially recessed). In one embodiment, the isolation trench 407 formed is a shallow trench, for example, less than approximately one micron.

Figure 4B:
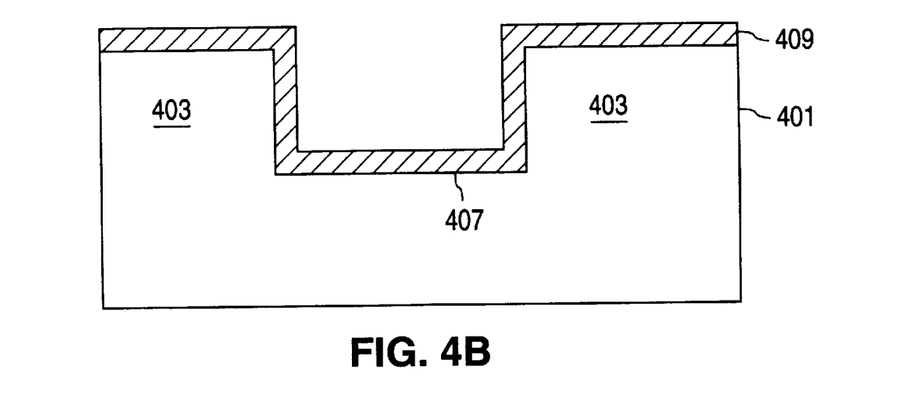
Figure 4C:
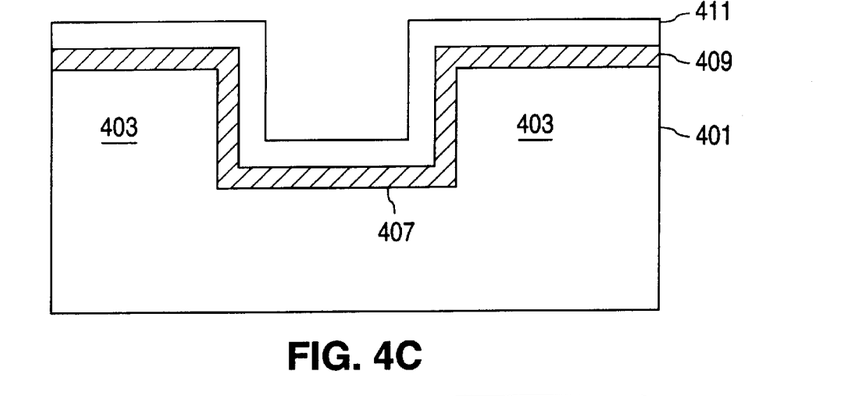

As shown in FIG. 4B, the resist 405 is removed and the exposed silicon is then oxidized by growing a layer of dielectric material 409 on the surface of the trench 407. Next, as shown in FIG. 4C, a layer of silicon nitride 411 is deposited on the silicon dioxide layer 409 in the trench 407, and above the active regions 403 of the silicon substrate 401. Typically, this nitride layer 411 is thin. In one embodiment, the nitride layer 411 is approximately 400 angstroms.

Figure 4D:
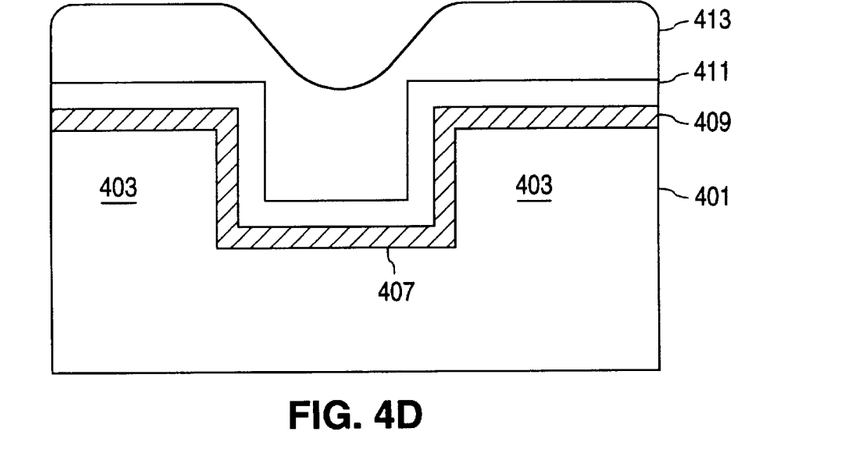

Then, as shown in FIG. 4D, a layer of polycrystalline silicon 413 is deposited over both the active regions 403 and the isolation region, formed by the trench 407, of substrate 401. This polycrystalline silicon layer 413 coats the silicon nitride layer 411. In one embodiment, a thick polycrystalline silicon layer 413 is deposited to approximately two-thirds the depth of the trench 407. This depth provides the polysilicon 413 with room to expand during the oxidation process, thereby eliminating the undesirable oxide bump over the field regions as created by some conventional isolation processes, for example, the process disclosed in the Burton et al. reference. As noted previously, this oxide bump can cause difficulty in the planarization step.

The silicon nitride layer 411 serves as a liner, separating the silicon dioxide layer 409, from the polycrystalline silicon layer 413. Silicon nitride is effective because oxygen and water vapor diffuse very slowly through it preventing oxidizing species form reaching the oxide layer beneath the nitride layer. In addition, the nitride itself oxidizes very slowly as the field polycrystalline oxide is grown. Thus, the nitride remains as an integral oxidation barrier layer during the entire field oxide growth step.

Figure 4E:
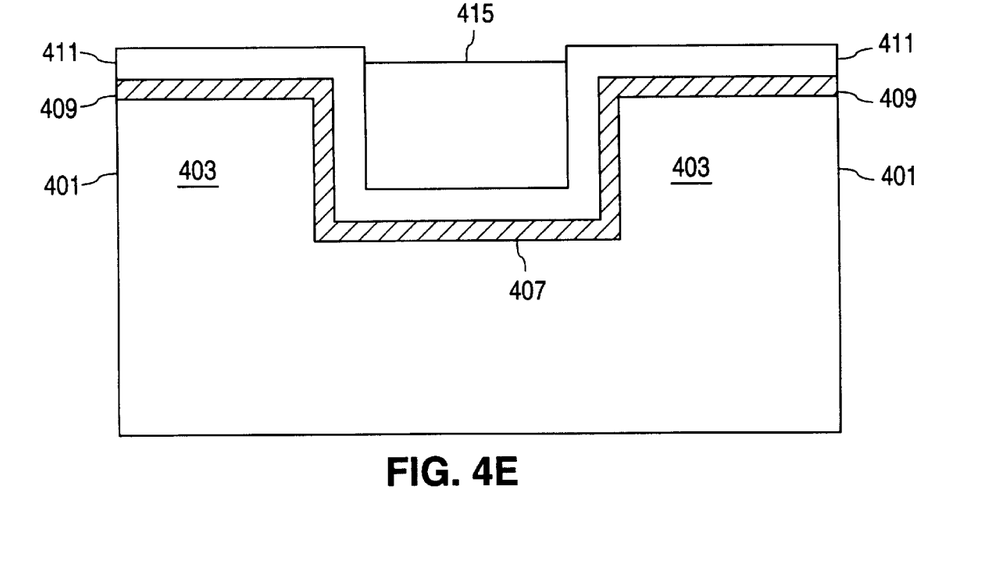

The polycrystalline silicon layer 413 is then oxidized to form a field oxide 415 and planarized to form the structure shown in FIG. 4E. In one embodiment, the polycrystalline silicon 413 is completely oxidized. Since the silicon nitride layer 411 prevents the volume expansion of the field oxide 415 into the sides or the bottom of the silicon substrate 401, the field oxide 415 expands upward, following the path of least resistance. Thus, since the process only involves oxidizing the polycrystalline silicon 415 rather than the silicon substrate 401, this technique relieves the stress on the silicon substrate 401.

Then, the field oxide 415 is planarized, for example, using Resist Etch Back (R.E.B.) or oxide reflow and etchback, until the first silicon nitride layer 411 is exposed. It will be appreciated that the polycrystalline silicon 413 can either be planarized and then oxidized or oxidized and then planarized. An advantage to etching back the polycrystalline silicon 413 before oxidation, is the ease of which the isolation technique of the present invention can be integrated into a conventional chemical mechanical polishing (CMP) isolation process.

Figure 4F:
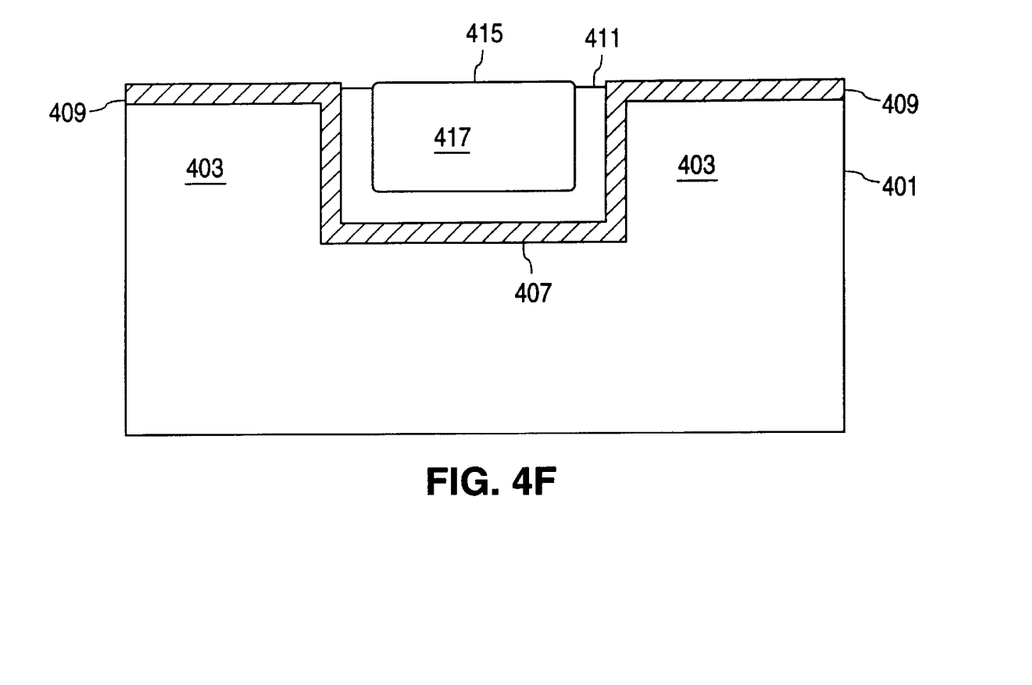

Then, as shown in FIG. 4F, the portion of the nitride layer 411 formed above the active regions 403 is removed, leaving a nitride-lined isolation region 417. A controlled hot phosphoric nitride strip is one technique that can be used to remove the nitride layer 411 to ensure the nitride is removed from the wafer surface, yet not removed from the lining of the trench.

Figure 4G:
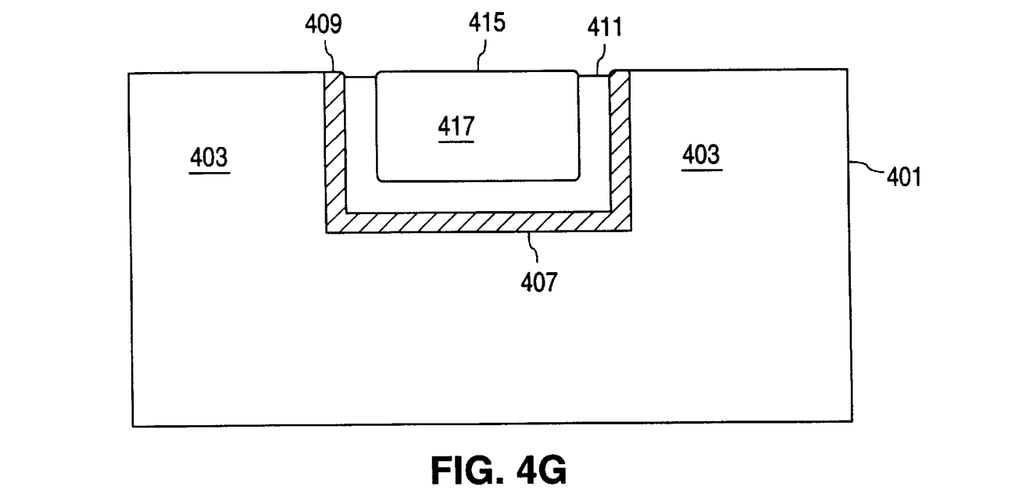

The result, as shown in FIG. 4G, is an isolation tub with a nitride liner 411 separating the silicon dioxide layer 409 from the oxidized polycrystalline silicon 415 and with zero oxide encroachment.

Various other modifications and alterations in the structure and method of operation of this invention will be apparent to those skilled in the art without departing from the scope and spirit of this invention. Although the invention has been described in connection with specific preferred embodiments, it should be understood that the invention as claimed should not be unduly limited to such specific embodiments.

What is claimed is:

1. An apparatus including an integrated circuit having an isolated region, the integrated circuit comprising:
    a substrate of semiconductor material having a first cavity disposed therein, said first cavity having sidewalls and a bottom;
    a dielectric layer formed in the first cavity;
    an oxide-resistant layer formed on the dielectric layer, wherein the dielectric layer and the oxide-resistant layer together form a second cavity lining the sidewalls and the bottom of the first cavity; and
    an oxidized polycrystalline silicon layer formed in the second cavity and within the substrate.

2. The apparatus of claim 1, wherein the oxide-resistant layer comprises silicon nitride.

3. The apparatus of claim 1, wherein the oxidized polycrystalline silicon layer fills at least two-thirds of the second cavity.

4. The apparatus of claim 1, wherein the oxide-resistant layer formed on the first dielectric layer is approximately 400 angstroms.

5. The apparatus of claim 1, wherein the first cavity has a depth of approximately one micron.

6. The apparatus of claim 1, wherein the oxidized polycrystalline silicon layer is substantially contained within the substrate.

7. The apparatus of claim 1, wherein the oxidized polycrystalline silicon layer fills the entire second cavity.

8. The apparatus of claim 1, wherein an upper surface of the first cavity, an upper surface of the second cavity and an upper surface of the oxidized polycrystalline silicon layer are substantially coplanar.

9. An apparatus including an integrated circuit having an isolated region, the integrated circuit comprising:
    a substrate of semiconductor material having a first cavity disposed therein, said first cavity having sidewalls and a bottom;
    a dielectric layer formed in the first cavity;
    an oxide-resistant layer formed on the dielectric layer, wherein the dielectric layer and the oxide-resistant layer together form a second cavity lining the sidewalls and the bottom of the first cavity; and
    an oxidized polycrystalline silicon layer formed in the second cavity and substantially filling the second cavity.

10. The apparatus of claim 9, wherein the oxide-resistant layer comprises silicon nitride.

11. The apparatus of claim 9, wherein the oxidized polycrystalline silicon layer fills at least two-thirds of the second cavity.

12. The apparatus of claim 9, wherein the oxide-resistant layer formed on the first dielectric layer is approximately 400 angstroms.

13. The apparatus of claim 9, wherein the first cavity has a depth of approximately one micron.

14. The apparatus of claim 9, wherein the oxidized polycrystalline silicon layer is substantially contained within the substrate.

15. The apparatus of claim 9, wherein an upper surface of the first cavity, an upper surface of the second cavity and an upper surface of the oxidized polycrystalline silicon layer are substantially coplanar.

16. An apparatus including an integrated circuit having an isolated region, the integrated circuit comprising:
    a substrate of semiconductor material having a first cavity disposed therein, said first cavity having sidewalls and a bottom;

a dielectric layer lining the sidewalls and the bottom of the first cavity;

an oxide-resistant layer lining the dielectric layer, wherein the dielectric layer and oxide-resistant layer together form a second cavity lining the sidewalls and the bottom of the first cavity; and an oxidized polycrystalline silicon layer formed in the second cavity and substantially filling the second cavity.

17. The apparatus of claim 16, wherein the first cavity has a depth of approximately one micron.

18. The apparatus of claim 16, wherein the oxidized polycrystalline silicon layer is substantially contained within the substrate.

19. The apparatus of claim 16, wherein the oxidized polycrystalline silicon layer fills the entire second cavity.

20. The apparatus of claim 16, wherein an upper surface of the first cavity, an upper surface of the second cavity and an upper surface of the oxidized polycrystalline silicon layer are substantially coplanar.

* * * * *